(12) United States Patent
Bills

(10) Patent No.: US 8,922,165 B2
(45) Date of Patent: Dec. 30, 2014

(54) CELL BALANCE CONFIGURATION FOR PIN COUNT REDUCTION

(75) Inventor: Peter J. Bills, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 401 days.

(21) Appl. No.: 13/471,402

(22) Filed: May 14, 2012

(65) Prior Publication Data

US 2013/0300371 A1 Nov. 14, 2013

(51) Int. Cl.
*H02J 7/00* (2006.01)
*G01N 21/00* (2006.01)
*G08B 21/00* (2006.01)

(52) U.S. Cl.
CPC .. *H02J 7/00* (2013.01); *G08B 21/00* (2013.01)
USPC ........... 320/118; 320/121; 320/134; 320/136; 324/427; 340/636.12; 340/636.13; 340/636.17; 307/41

(58) Field of Classification Search
CPC .......... H02J 7/00; G01N 27/416; G08B 21/00
USPC .................. 320/118, 121, 134, 136; 324/427; 340/636.12, 636.13, 636.17; 307/41
See application file for complete search history.

(56) References Cited

U.S. PATENT DOCUMENTS

| | | | |
|---|---|---|---|
| 6,841,971 B1 * | 1/2005 | Spee et al. | 320/119 |
| 7,638,979 B2 * | 12/2009 | Vandensande | 320/136 |
| 7,948,218 B2 * | 5/2011 | Regazzi et al. | 322/28 |
| 7,990,276 B2 * | 8/2011 | Cruise | 340/636.2 |
| 8,058,845 B2 * | 11/2011 | Tange et al. | 320/134 |
| 8,711,536 B2 * | 4/2014 | Makihara | 361/93.1 |
| 2007/0182377 A1 * | 8/2007 | Vandensande | 320/132 |
| 2009/0009133 A1 * | 1/2009 | Tange et al. | 320/132 |
| 2009/0021224 A1 * | 1/2009 | Regazzi et al. | 322/28 |
| 2009/0174563 A1 * | 7/2009 | Cruise | 340/636.2 |
| 2012/0119704 A1 * | 5/2012 | Beranger et al. | 320/117 |
| 2012/0177958 A1 * | 7/2012 | Tsutsumi et al. | 429/53 |
| 2012/0250203 A1 * | 10/2012 | Makihara | 361/86 |

OTHER PUBLICATIONS

Paul Rako, Battery-Stack-Monitor ICs Scrutinize the Cells, EDN, pp. 36-43, Jan. 20, 2011.
Linear Technology, Multicell Battery Stack Monitor, LTC6802-1, pp. 1-38, 2009.
Linear Technology, Multicell Addressable Battery Stack Monitor, LTC6802-2, pp. 1-34, 2009.
Daniel Torres, Multi-Cell Li-Ion Battery Management System Using MSP430F5529 and bq76PL536, Texas Instruments, Application Report, pp. 1-13, Dec. 2010.

* cited by examiner

*Primary Examiner* — Phallaka Kik

(57) ABSTRACT

Embodiments of an electronic circuit for monitoring a battery stack enable cell balancing while conserving pin-count of the circuit package. The illustrative electronic circuit comprises a battery monitoring integrated circuit configured for monitoring a plurality of cells in the battery stack. The battery monitoring integrated circuit is arranged to share a common node pin between two adjacent battery cells in the battery stack for the purpose of cell balancing.

20 Claims, 12 Drawing Sheets

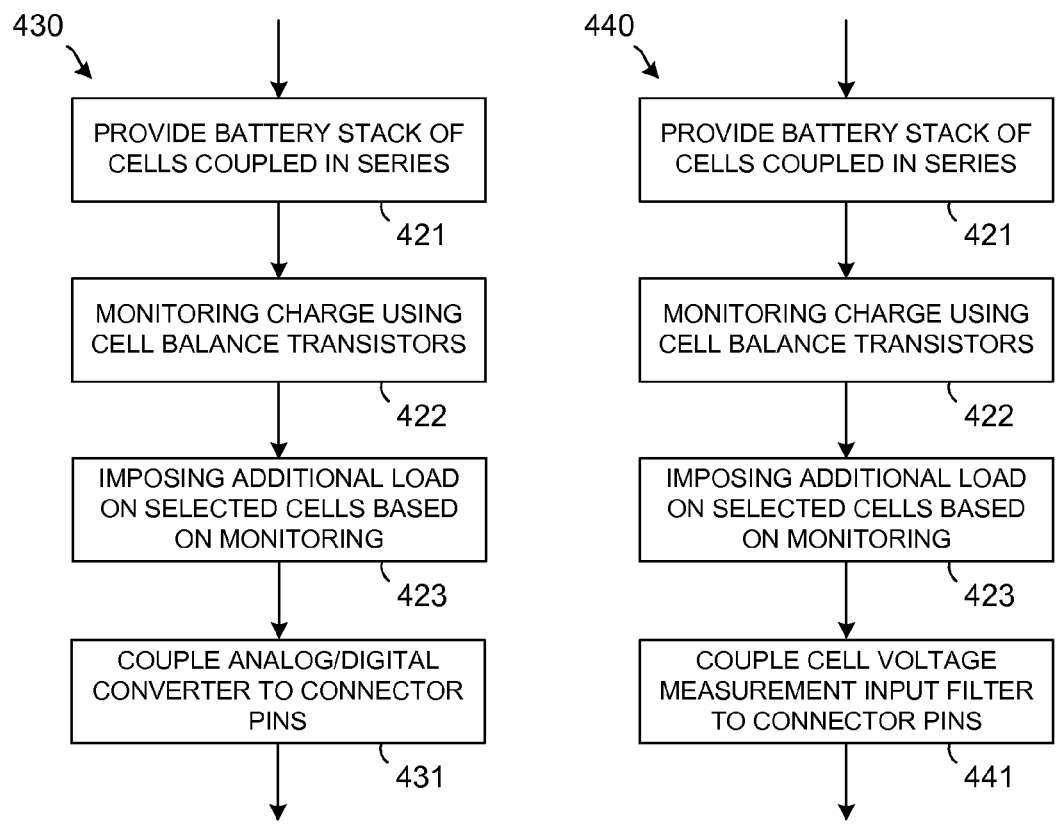
FIG. 4.1

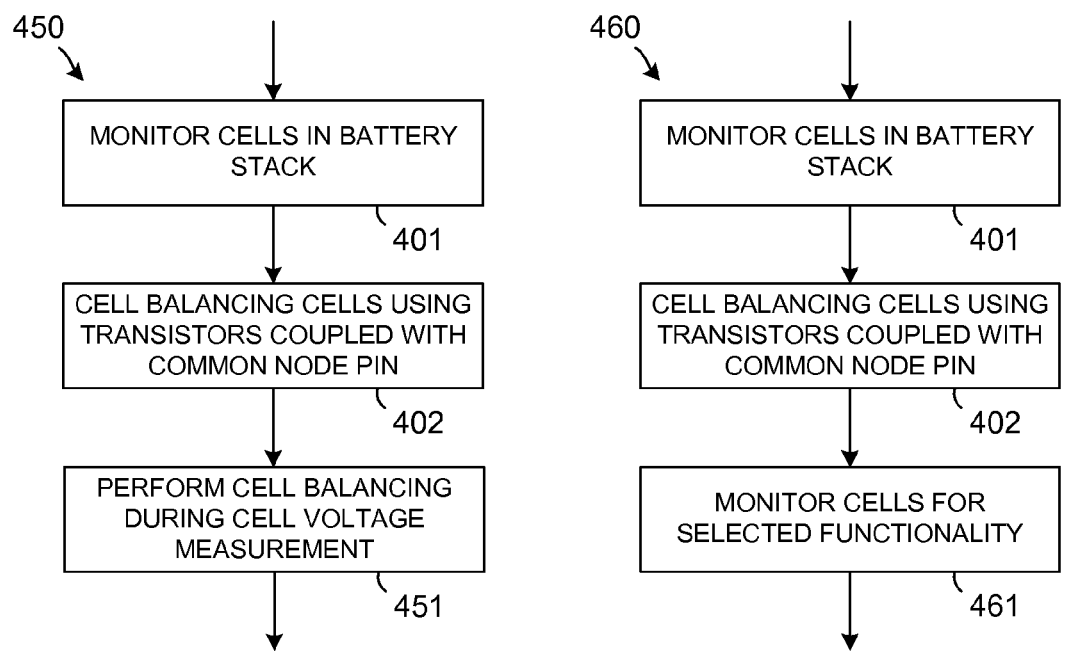
FIG. 4.2

CELL BALANCE CONFIGURATION FOR PIN COUNT REDUCTION

BACKGROUND

The duration of battery functionality for multiple cells can be extended through cell balancing. For example, a battery management circuit can include an analog front end that balances the multiple battery cells and eliminates mismatches of cells in a series or parallel combination to substantially improve battery efficiency and increase overall battery stack capacity. For an increasing number of cells and load currents in a battery stack, the potential for mismatch increases for two types of mismatch—state of charge mismatch and the less-common capacity/energy mismatch. Both types of mismatch limit the battery stack capacity (mAh) to the capacity of the weakest cell.

BRIEF DESCRIPTION OF THE DRAWINGS

Embodiments of the invention relating to both structure and method of operation may best be understood by referring to the following description and accompanying drawings.

DETAILED DESCRIPTION

Figure 1:
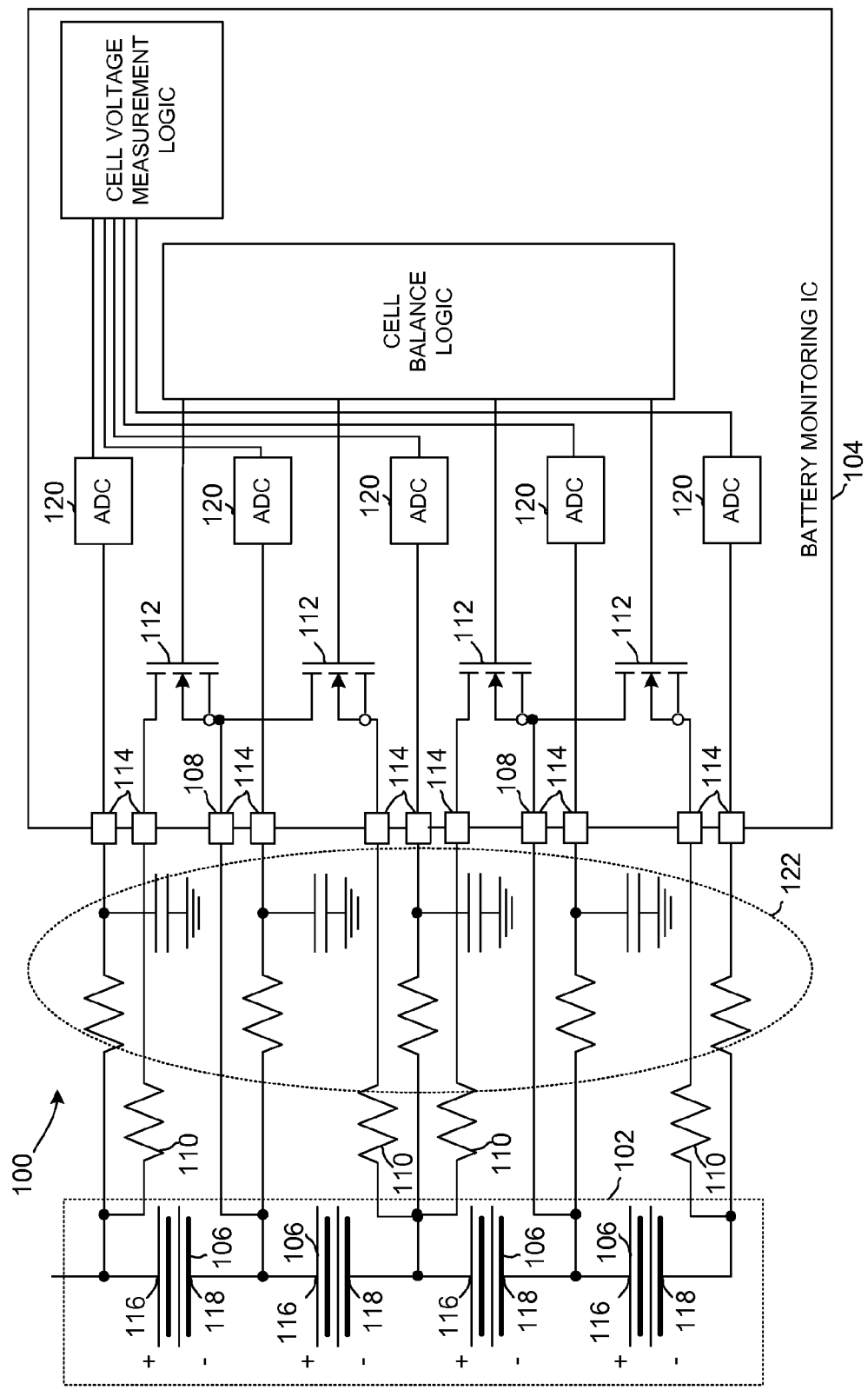
FIG. 1 is a schematic circuit diagram depicting an embodiment of an electronic circuit for monitoring a battery stack that enables cell balancing while conserving pin-count of the circuit package.

Cell balancing can be defined as a state in which the cells of a battery stack are balanced when all the cells in the battery stack are in compliance with two conditions.

First, if all cells have the same capacity, the cells are balanced when all have the same state of charge. Here, the open circuit voltage is an accurate indication of the state of charge. A battery stack that is out of balance can be differentially charged to full capacity, thereby attaining a suitable level of balance that enables the cells to subsequently cycle normally without additional adjustment. Thus, differential charging achieves balance in a single operation.

Second, cells with different capacities can be considered to be balanced when the state of charge is the same for all cells. However, because the state of charge is a relative measure, the absolute amount of capacity for each cell is different. Maintaining cells with different capacities at the same state of charge can be attained using cell balancing to supply different amounts of current to cells in the series string during both charge and discharge on every cycle.

Embodiments of an electronic device or system and associated method facilitate a cell balance method, for example for cell balancing of lithium ion batteries.

One design aspect for integrated circuits is the handling of a limited number of integrated circuit contact pins. In a battery management circuit, embodiments disclosed herein enable reduction of the integrated circuit pins for passive cell balancing in a battery monitoring application.

The disclosed embodiments including systems, devices, circuits, and associated methods may enable reduction of the number of pins to perform the cell balancing function. Pin count reduction enables a corresponding reduction in packaging costs, integrated circuit costs, associated printed circuit board area while maintaining cell voltage measurement precision and accuracy while cell balancing is enabled.

In a particular application, the disclosed circuits, structures, and methods facilitate protected internal cell balance metal-oxide semiconductor field effect transistors (MOSFETs), and a filter on cell voltage analog-do-digital converter (ADC) input pins on a suitably sized integrated circuit package, such as a 64-pin quad-flat no-leads (QFN) package. Accordingly, the number of input/output (I/O) pins utilized to achieve cell balancing internal to an integrated circuit can be reduced.

In various embodiments and/or applications, a circuit and system can share a common node pin between two adjacent battery cells for the purpose of cell balancing.

In some embodiments, the disclosed circuit and associated method enables a user to include cell balancing functionality in a reduced pin count package without affecting the precision and accuracy of the cell voltage measurement while cell balance is enabled.

In some embodiments, the disclosed circuit and method enables a user to include a cell voltage measurement input filter as well as operational onboard cell balance field effect transistors (FETs).

In particular embodiments, the number of integrated circuit pins that are used for cell balancing can be reduced from four to three for any of two adjacent battery cells by sharing the common node between the two cells.

Accordingly, the disclosed systems, circuits, and methods may enable applications such as onboard cell balancing in which battery cell balancing is electrically independent of operation of the battery cell voltage measurement circuit and significant cost and performance advantages are attained.

The illustrative circuits and systems, along with associated methods enable integrated circuit pin sharing in battery management applications, for example in battery operated equipment, automotive high voltage battery management systems, electric vehicle battery systems, high voltage battery management systems (HVBMS), battery operated industrial equipment, handheld battery operated equipment, electric power commercial battery backup systems, lithium ion cell balancing circuits, and the like.

Automotive high voltage battery management systems, electric vehicles and some hybrid systems which include a battery pack such as a 48-volt battery pack have a cell balancing functionality, for example for lithium ion and LiPO$_4$ type batteries.

Cell balancing may be used in any type of battery stack, for example a stack which includes lithium ion technologies.

Systems with a large number of battery cells, for example low voltage systems such as 48 volt lithium ion batteries, include multiple cells (for example twelve cells) coupled in series. The batteries are monitored and can use passive balancing to attain substantial longevity of the cells.

Cell balancing electronics can function by applying differential currents to individual cells or combinations of cells in a series strings. For a normally operating battery stack, cells in a series string receive identical or approximately identical currents. A battery stack can include additional components and circuitry to perform cell balancing. Otherwise, another arrangement can use a fully integrated analog front end for cell balancing which reduces external components to balancing resistors.

Referring to FIG. 1, a schematic circuit diagram depicts an embodiment of an electronic circuit 100 for monitoring a battery stack 102 that enables cell balancing while conserving pin-count of the circuit package. The illustrative electronic circuit 100 comprises a battery monitoring integrated circuit 104 configured for monitoring a plurality of cells 106 in the battery stack 102. The battery monitoring integrated circuit 104 is arranged to share a common node pin 108 between two adjacent battery cells 106 in the battery stack 102 for the purpose of cell balancing.

In the illustrative embodiment, the electronic circuit 100 can further comprise at least one external resistor 110 coupled to battery cells 106 in the battery stack 102 which is configured to dissipate power of the battery cell 106.

In some embodiments, the battery monitoring integrated circuit 104 can comprise a plurality of connector pins 114 and a plurality of cell balance transistors 112 coupled to the plurality of connector pins 114 for connection to the battery stack 102 which comprises a plurality of cells 106 coupled in series. One or more of the plurality of cell balance transistors 112 form a source-drain pathway connected between connector pins 114 coupled between the positive terminal 116 and negative terminal 118 of one or more of the cells 106 such that adjacent cell balance transistors 112 share a connector pin 108 of the plurality of connector pins 114.

In some embodiments of the electronic circuit 100, the plurality of cell balance transistors 112 can be field effect transistors (FETs). Other embodiments can use other types of transistors.

In particular embodiments the electronic circuit 100, the plurality of cell balance transistors 112 can be field effect transistors selected from at least one of n-channel metal-oxide semiconductor (NMOS) and p-channel metal-oxide semiconductor (PMOS) transistors.

In embodiments such as that depicted in FIG. 1, the electronic circuit 100 can be configured such that the battery monitoring integrated circuit 104 further comprises an analog to digital converter 120 coupled to coupled to selected pins of the plurality of connector pins 114 including connector pins configured for coupling to positive terminals 116 of the cells 106 and connector pins configured for coupling to the negative terminals 118 of the cells 106.

In some applications and/or embodiments, the electronic circuit 100 can be formed wherein the battery monitoring integrated circuit 104 is configured for performing cell balancing in a package that reduces pin count by sharing selected pins 108 of the plurality of connector pins 114 that connect between adjacent cell balance transistors 112.

In embodiments of the electronic circuit 100 such as that depicted in FIG. 1, the battery monitoring integrated circuit 104 can include in the plurality of connector pins 114, selected connector pins configured for performing cell voltage measurements and selected connector pins configured for performing cell balancing such that precision and accuracy of cell voltage measurement is maintained when cell balance functionality is enabled.

Some embodiments of the electronic circuit 100 can further comprise a cell voltage measurement input filter 122 coupled to the battery monitoring integrated circuit 104 at selected pins of a plurality of connector pins 114.

In particular embodiments, the electronic circuit 100 can further comprise a cell voltage measurement input filter 122 coupled to the battery monitoring integrated circuit 104 at selected connector pins wherein the input filter 122 can be used to improve cell voltage measurement accuracy, avoiding aliasing of signals presented to measurement. The battery monitoring integrated circuit 104 can comprise a plurality of cell balance field effect transistors 112 integrated onto the battery monitoring integrated circuit 104.

In the illustrative embodiment, the lowpass filter (LPF) 122 is positioned external to the battery monitoring integrated circuit 104. Although the LPF 122 can be positioned internally, such a configuration prevents adjustment of frequencies on the filter, decreasing usefulness since filter characteristics would be fixed. Also, in some embodiments, an internal LPF in the IC would be very difficult to accomplish to attain a low-frequency lowpass filter because the capacitor is relatively large compared to the size of capacitors that are on the IC.

In the illustrative embodiment, the electronic circuit 100 can include the battery monitoring integrated circuit 104 which comprises a plurality of connector pins 114 including selected connector pins allocated for balancing cells of the plurality of cells 106 in a battery stack 102 wherein two adjacent cells are coupled to three of the selected connector pins 114 including the common node pin 108 shared between the two adjacent cells 106.

Thus, rather than using four pins for cell balancing, including individual pins for the source of a FET and an individual pin for the drain of the FET, instead one pin is shared between the two cells of adjacent cells. So each FET is connected to the same pin which is terminated to the battery.

In various applications and/or embodiments, the electronic circuit 100 can include the battery monitoring integrated circuit 104 which is configured for cell balance and cell voltage measurement functionality in at least one system selected from automotive high voltage management, battery-operated industrial equipment, hand-held battery-operated equipment, electric power commercial battery backup, electric vehicle battery, lithium ion battery, and the like.

In various embodiments, the electronic circuit 100 and battery monitoring integrated circuit 104 can be configured for usage with a battery stack 102 with any suitable number of battery cells 106. For example, a battery stack 102 which includes fourteen cells 106 can be a useful arrangement. All cells 106 (for example, all fourteen cells 106) can be linked in series and all of the fourteen cells 106 monitoring by the battery monitoring integrated circuit 104 to determine imbalances for all cells 106. The cell with the highest power can be loaded with resistance to attain balance.

The embodiment or the portion of an embodiment of the electronic circuit 100 shown in FIG. 1 depicts a battery stack 102 with four cells 106. In an arrangement with fourteen cells 106, one pin is saved per two cells so that for adjacent cells of the fourteen cells the number of pins is reduced from four to three pins, resulting in a total savings of seven pins. The arrangement of fourteen cells 106 includes corresponding cell balance field effect transistors for each of the cells 106 with a shared pin coupled between adjacent transistors.

The battery monitoring integrated circuit 104 can be configured for cell balancing and cell voltage and temperature measurement functionality. Example embodiments of the battery monitoring integrated circuit 104 can calibrate for temperature. For example, a system can calibrate with every reading. As a command is sent for a conversion on the cell voltage, a temperature reading can be acquired first, the ADC and components can be calibrated to that temperature, and then ADC conversion on the input signals can be performed. On-board cell balancing is improved through the calibration operations.

The electronic circuit 100 incorporates components including external bias resistors 110 operable as balancing resistors in which energy is expended for a particular battery cell 106 that is loaded for balancing. Other components of the electronic circuit 100 include cell balance switch FETs 112. The circuit is arranged to save an IC pin for adjacent battery cells 106. The illustrative configuration saves pins by combining pin usage for adjacent battery cells rather than, for example, sharing ADC pins used for battery measurements to eliminate the necessity for disabling cell balancing when making measurements.

The low pass filters 122 are external to the battery monitoring integrated circuit 104 so that cell balancing can be enabled or disabled and cell balancing can be performed without affecting measurements.

The illustrative integrated circuit 100 enables improved functionality in a particular package, for example a 64-pin package, by saving pins, for example a savings of eight pins.

Figure 2:
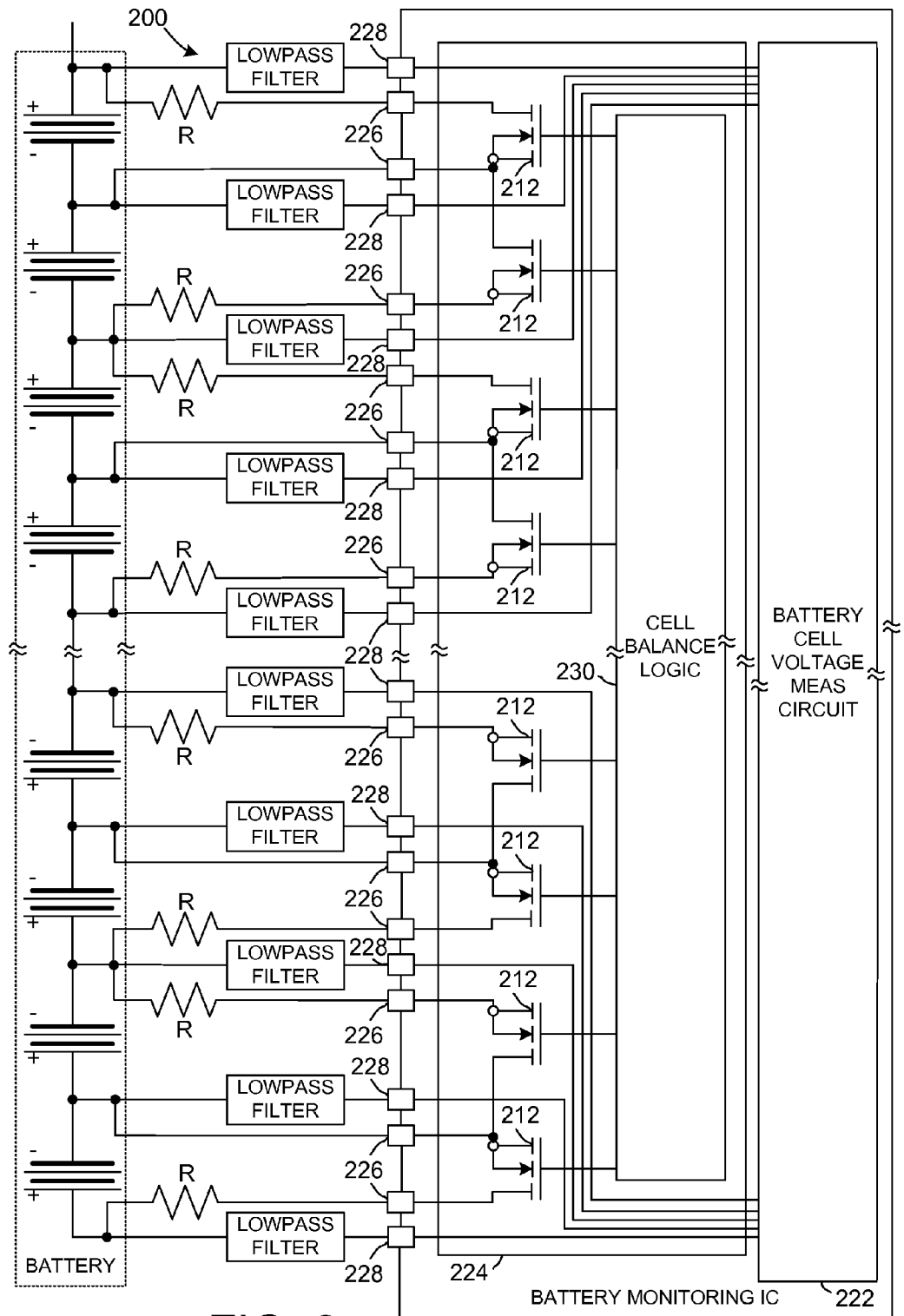
FIG. 2 is a schematic block and circuit diagram showing an embodiment of an electronic circuit that is adapted for battery monitoring and facilitates enables cell balancing while conserving pin-count of the circuit package.

Referring to FIG. 2, a schematic block and circuit diagram depicts an embodiment of an electronic circuit 200 that is adapted for battery monitoring. The electronic circuit 200 can comprise a plurality of connector pins, a battery cell voltage measurement circuit 222, and an on-chip cell balancing circuit 224. The plurality of connector pins can comprise at least cell balance connector pins 226 and cell voltage measurement connector pins 228 distinct of the cell balance connector pins 226. The battery cell voltage measurement circuit 222 can be selectively coupled to one or more of the cell voltage measurement connector pins 228. The on-chip cell balancing circuit 224 is selectively coupled to one or more of the cell balance connector pins 226 and includes cell balance transistors 212 and cell balancing logic 230.

Figure 3:
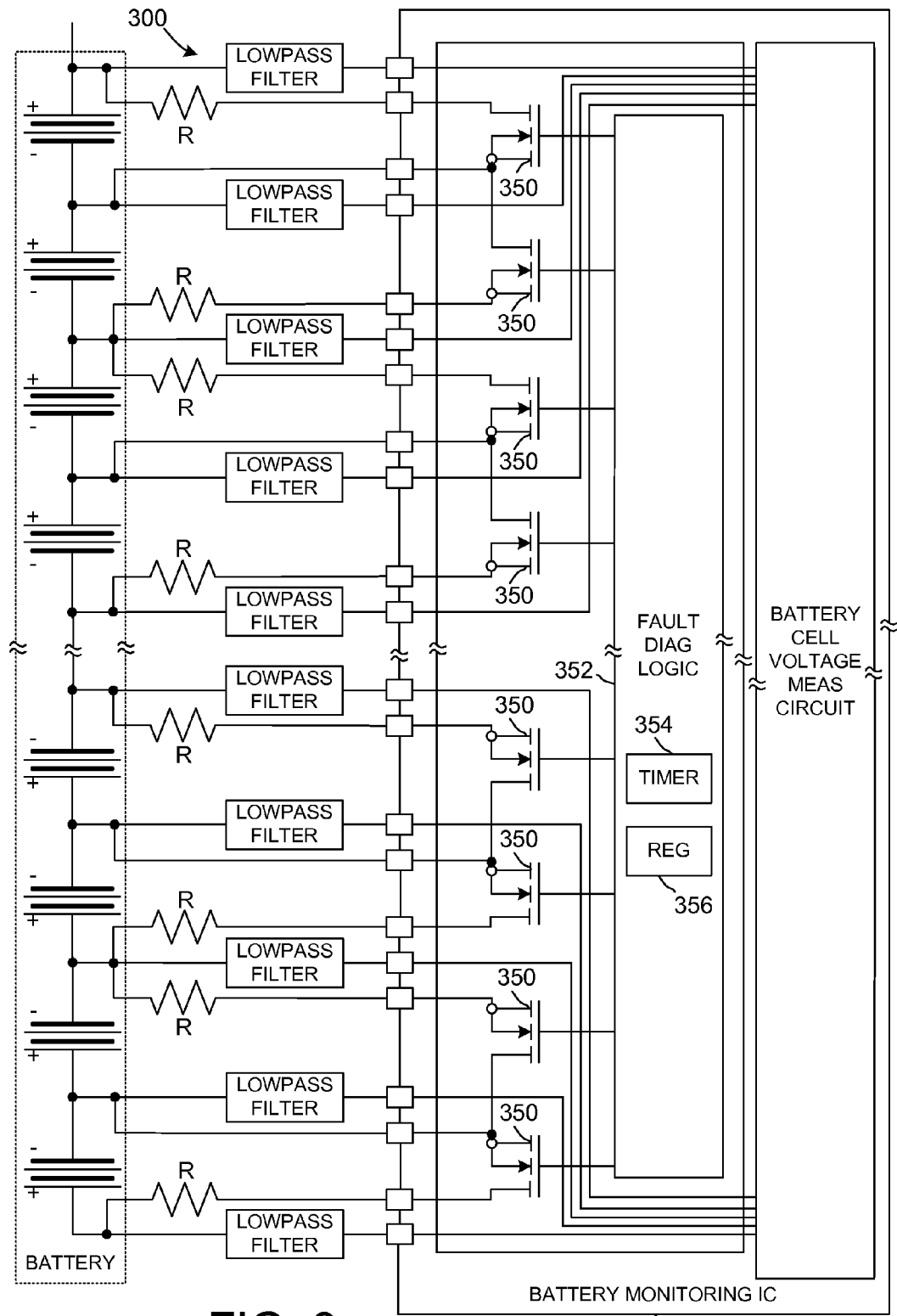
FIG. 3 is a schematic and circuit diagram illustrating an embodiment of an electronic circuit which is adapted for battery monitoring.

Referring to FIG. 3, a schematic and circuit diagram illustrates an embodiment of an electronic circuit 300 which is adapted for battery monitoring. The electronic circuit 300 can include a battery monitoring integrated circuit 304 which comprises a plurality of cell balancing drivers 350, fault diagnostic logic 352 coupled to the cell balancing drivers 350, and a cell balance timer 354. The battery monitoring integrated circuit 304 can further comprise a programmable register 356 configured to program the cell balance timer 354, enable open load detect current, and enable the plurality of cell balancing drivers 350.

Figure 4:
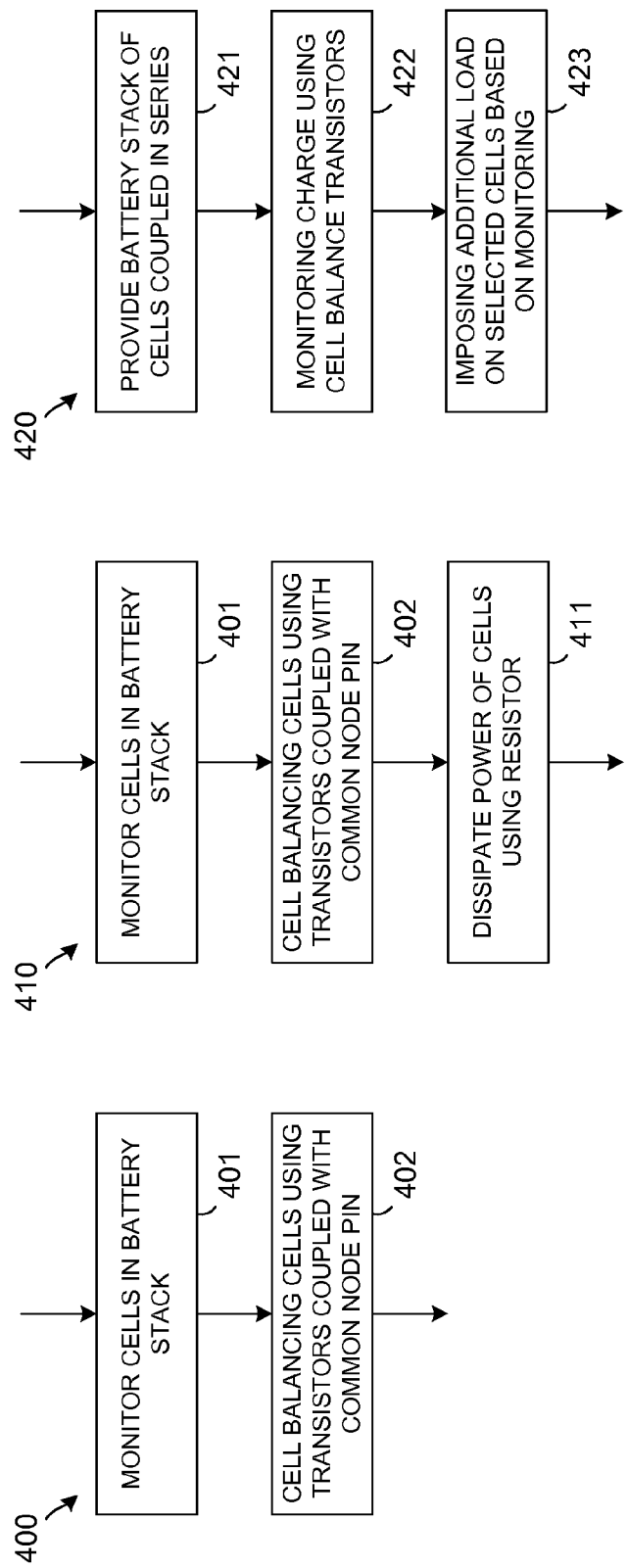
FIG. 4, including FIGS. 4.1 and 4.2, includes schematic flow charts depicting an embodiment or embodiments of a method for operating an electronic circuit for monitoring a battery stack that enables cell balancing while conserving pin-count of the circuit package.

Referring to FIG. 4, including FIGS. 4.1 and 4.2, schematic flow charts depict an embodiment or embodiments of a method for operating an electronic circuit for monitoring a battery stack that enables cell balancing while conserving pin-count of the circuit package. In an example embodiment, aspects of the operating method can be performed, for example, using cell balance circuitry including the transistors 112 and cell balance logic shown in FIG. 1. An embodiment of a method 400 for operating an electronic circuit can comprise monitoring 401 a plurality of cells in a battery stack, and cell balancing 402 selected cells in the battery stack using a plurality of cell balancing transistors coupled to the plurality of cells with a common node pin shared between two adjacent cells.

Further embodiments of a method 410 for operating an electronic circuit can comprise dissipating 411 power of one or more of the plurality of cells in the battery stack using at least one external resistor.

Additional embodiments and/or applications of a method 420 for operating an electronic circuit can comprise providing 421 a battery stack comprising a plurality of cells coupled in series, monitoring charge 422 in a plurality of cell balance transistors coupled to the plurality of cells via a plurality of connector pins wherein one or more of the plurality of cell balance transistors are coupled to form a source-drain pathway connected between connector pins coupled between the positive and negative terminal of one or more of the cells. A connector pin of the plurality of connector pins can be shared between adjacent cell balance transistors. Additional load can be imposed 423 on selected cells of the battery stack based on the monitored charge using the plurality of cell balance tranisistors.

Various embodiments and/or applications of a method 430 for operating an electronic circuit can comprise coupling 431 an analog to digital converter to selected ones of the plurality of connector pins comprising connector pins configured for coupling to the positive terminal of one or more of the plurality of cells and connector pins configured for coupling to the negative terminal of one or more of the plurality of cells.

Various embodiments of a method 440 for operating an electronic circuit can further comprise coupling 441 a cell voltage measurement input filter to selected pins of a plurality of connector pins.

Similarly, some embodiments and/or applications of a method 450 for operating an electronic circuit can comprise performing 451 cell balancing concurrently with cell voltage measurement. In some embodiments, cell balancing can be performed wherein precision and accuracy of cell voltage measurement is maintained when cell balance functionality is enabled.

Particular embodiments of a method 460 for operating an electronic circuit can further comprise monitoring 461 the plurality of cells in the battery stack for cell balance and cell voltage measurement functionality in at least one system selected from a group of systems consisting of automotive high voltage management, battery-operated industrial equipment, hand-held battery-operated equipment, electric power commercial battery backup, electric vehicle battery, and lithium ion battery.

Figure 5:
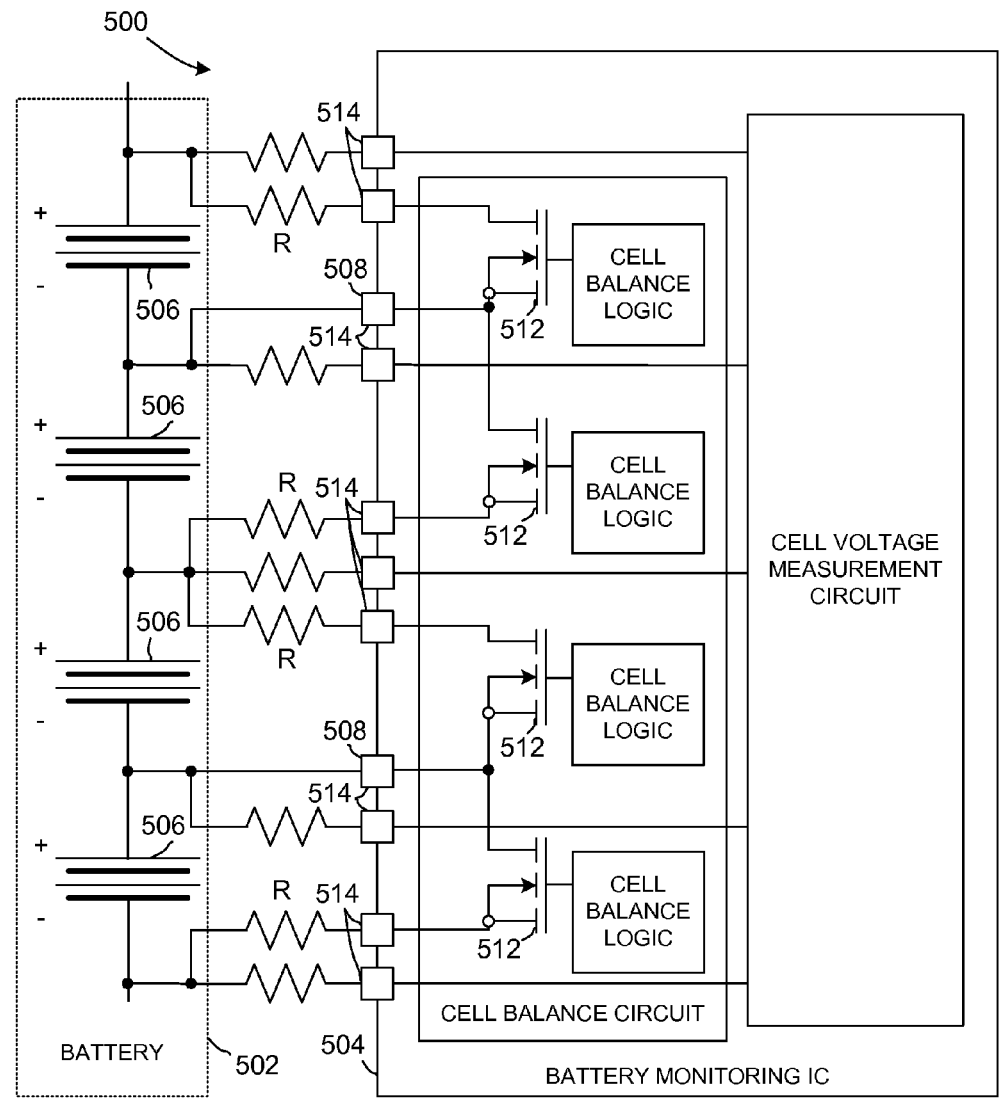
FIG. 5 is a schematic circuit diagram showing an embodiment of an electronic circuit for monitoring a battery stack that enables cell balancing while conserving pin-count of the circuit package.

Referring to FIG. 5, a schematic circuit diagram depicts an embodiment of an electronic circuit 500 for monitoring a battery stack 502 that enables cell balancing while conserving pin-count of the circuit package. The illustrative electronic circuit 500 can comprise a battery monitoring integrated circuit 504 for monitoring a plurality of cells 506 in a battery stack 502, and connectors 514 for coupling the battery monitoring integrated circuit 504 to the battery stack 502. The electronic circuit 500 can further comprise transistors 512 for arranging the battery monitoring integrated circuit 504 to share a common node pin 508 between two adjacent battery cells in the battery stack 502 for the purpose of cell balancing.

Figure 6:
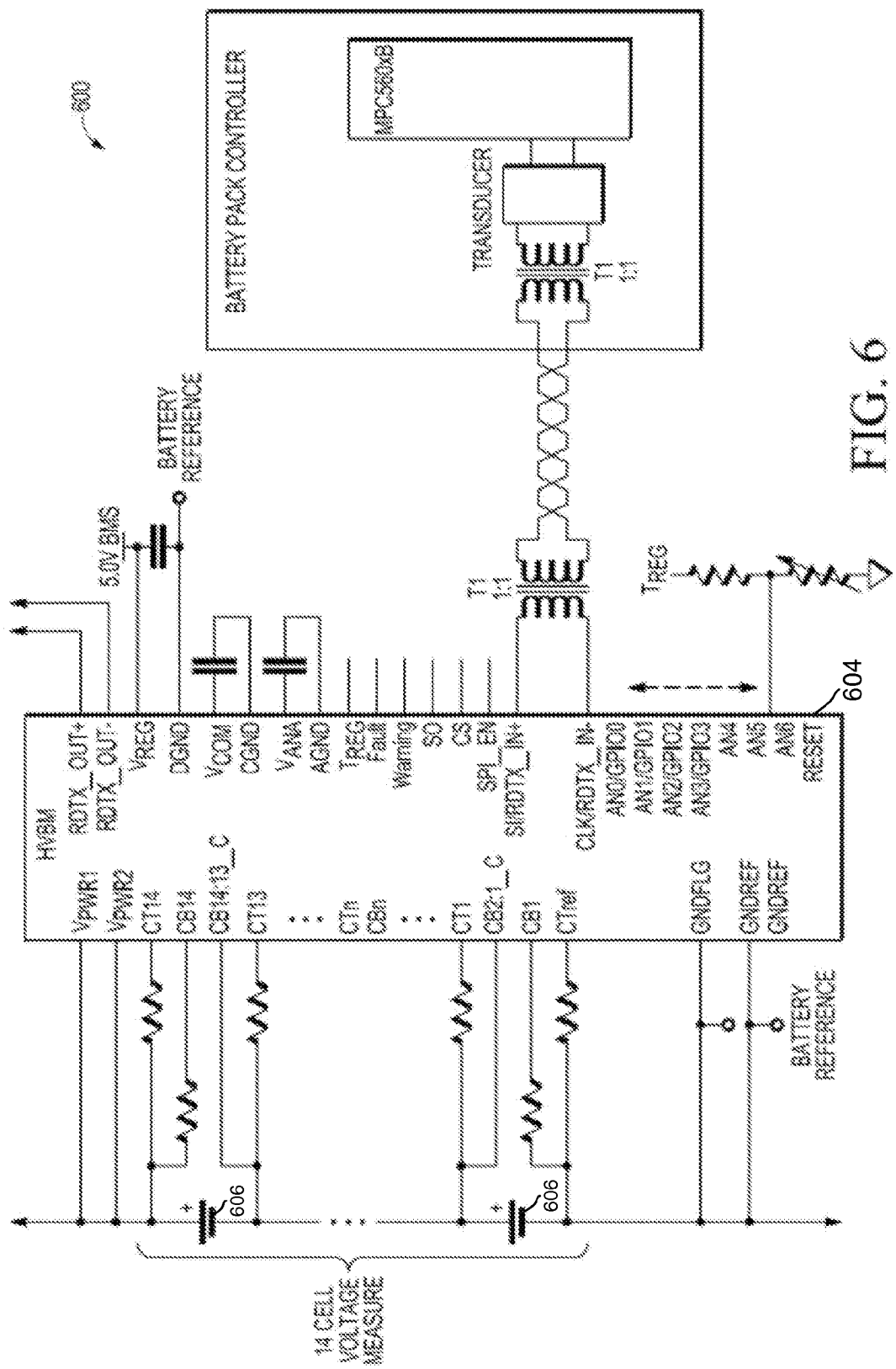
FIG. 6 is a schematic block and circuit diagram illustrates an embodiment of a system that includes an automotive high voltage battery management integrated circuit that implements the disclosed pin reduction technique for lithium ion passive cell balancing.

Referring to FIG. 6, a schematic block and circuit diagram illustrates an embodiment of a system 600 that includes an automotive high voltage battery management integrated circuit 604 that implements the disclosed pin reduction technique for lithium ion passive cell balancing. The illustrative automotive high voltage battery management (HVBM) IC 604 can be used to monitor lithium iodide battery cells 606 and is operable to measure cell voltage and to measure total stack voltage. The automotive high voltage battery management IC 604 includes seven general-purpose I/O (GPIO), ADC, and temperature sensor input pins (Ann/GPIOn and ANn) for monitoring temperature under load. The automotive high voltage battery management IC 604 also has cell terminal connector pins (CTn) and cell balance connector pins (CBn). The automotive high voltage battery management IC 604 is also configured to perform on-board passive cell balancing with diagnostics. The pin count on the illustrative device is 64 leads. To include the specified features in one package with the specified functionality, a unique technique is used to share pins.

The illustrative automotive high voltage battery management IC 604 includes a passive cell balancing functionality. In various battery systems, two types of cell balancing can be used including passive cell balancing and active cell balancing. Balancing of the cells is used to maintain the voltage of each cell relatively the same. For example, a battery stack that includes fourteen (14) cells uses current from each of the battery cells in series. One of the cells may be weaker than another cell and the weaker cell can have a voltage that diminishes more rapidly than the other cells.

To maintain the battery voltage and attain the maximum amount of use from the battery the cells are to maintain the same voltage. The relatively stronger cells can be burdened with an additional load in a passive cell balancing operation.

In contrast, an active cell balancing functionality involves shifting energy from the stronger cells and distributing the shifted energy to the weaker cells. Active cell balancing costs significantly more and is much more complicated than the passive method.

Thus, the illustrative automotive high voltage battery management IC 604 Implements the passive cell balancing method. Referring again to FIG. 1, the circuit can include field effect transistors (FETs) for cell balancing in which the source of FET 112 is tied to the drain of the next FET 112 and share common pins 108 on the IC 104. Each of these devices 112 functions as a cell-balancing switch. The source of one FET 112 and the drain of the other FET 112 coupled to adjacent cells are common to one pin 108.

Internal to the illustrative battery monitoring integrated circuit 104 is a drain of the cell-balancing FET 112 coupled to a cell balance load resistor 110 tied to the positive terminal 116 of the battery cell 106. In an example embodiment the resistor 110 can be specified at 15 ohms, two watts, although any suitable specifications can be used. A common node 108 is a node which forms a shared cell balance pin and is tied to the drain of the cell balancing FET 112. The source of the cell balancing FET 112 is tied directly to the node between the two battery cells at the center terminal of voltage battery cells at the negative terminal 118 of one cell and the positive terminal 116 of the other cell 106.

To balance a cell, a cell-balancing FET that shares a common pin with an adjacent cell-balancing FET can be configured in source-follower configuration and applies power, for example, to a 15 ohm, two watt resistor 110. The two watt resistors 110 can be used to expend power and to deplete the particular cell with excess charge. Thus, cell balance logic drives the FETs so that additional load is applied to the relatively stronger cells in the battery stack 102. The cell balance logic draws energy from a cell or cells with the most charge and wastes the charge as heat through the two-watt resistor. For example, charge can be measured for all cells in series and the transistors can turn on cell balancing for one or more cells in which charge is highest.

Figure 7:
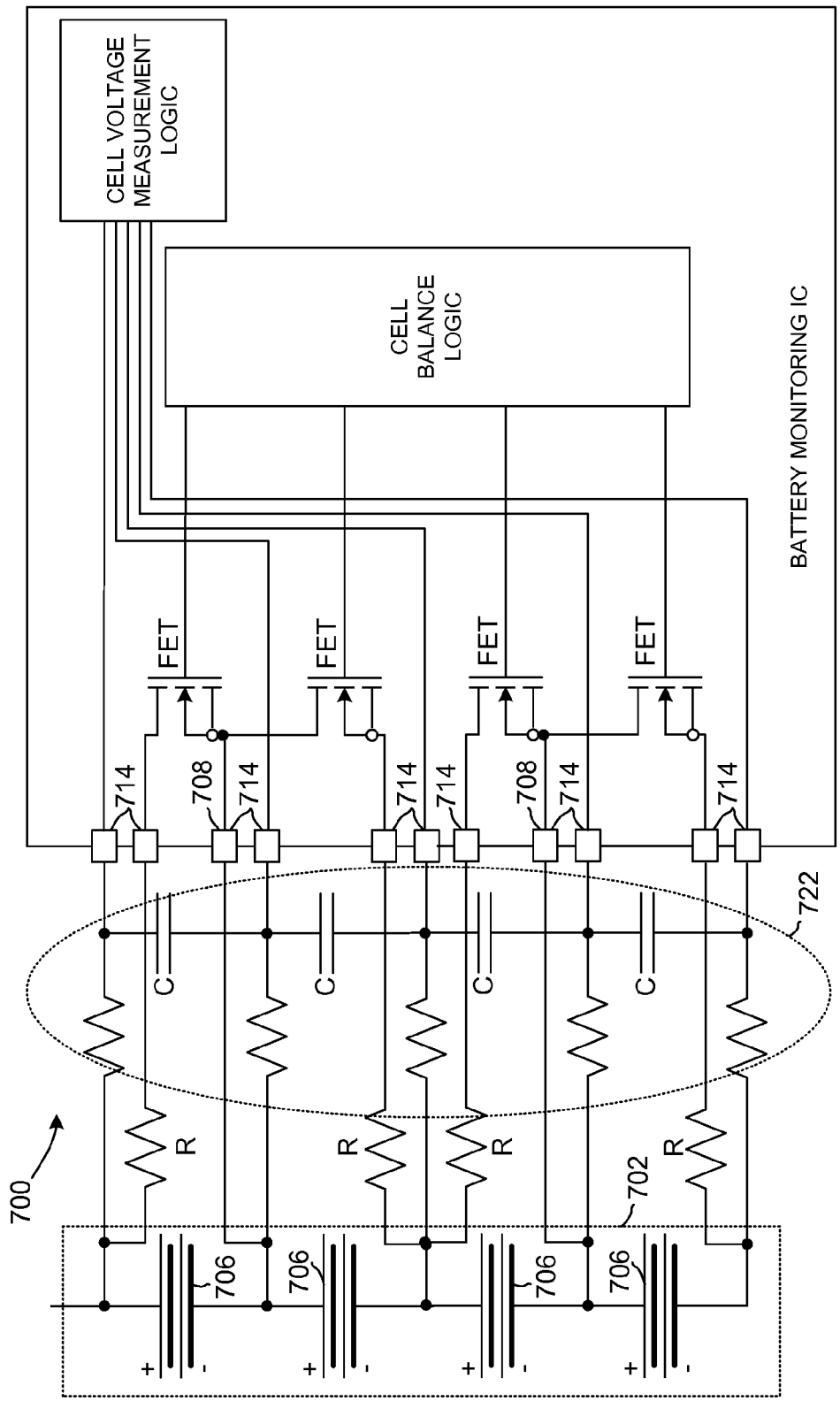
FIG. 7 is a schematic circuit diagram depicting an embodiment of an electronic circuit for monitoring a battery stack that enables cell balancing while conserving pin-count of the circuit package.

Referring to FIG. 7, a schematic circuit diagram depicts an embodiment of an electronic circuit 700 for monitoring a battery stack 702 that enables cell balancing while conserving pin-count of the circuit package. A battery monitoring integrated circuit 704 is arranged to share a common node pin 708 between two adjacent battery cells 706 in the battery stack 702 for the purpose of cell balancing. The electronic circuit 700 differs from the electronic circuit 100 shown in FIG. 1 in that in the lowpass filter 722, the capacitor is connected across the positive and negative terminals of the cells 706 of the battery stack 702 rather than tied to ground. In FIG. 1, the capacitors in the electronic circuit 100 are shown connected to ground or connected to the lowest potential in the battery stack 102 so each cell terminal has a capacitor connected to the battery reference which is the lowest point in the system.

With the capacitors connected across the terminals coupled to the cells 706 of the battery stack 702 as shown in FIG. 7 with a capacitor filter 722 connected to input pins 714. A capacitive divider is formed so any transient voltage or sinewave voltage on the full stack 702 is divided down equally across all of the capacitors. Connecting the capacitors to ground enables a high accuracy of measurement, for example one millivolt of accuracy.

In contrast, other arrangements can be used to share integrated circuit pins that do not share a common node pin between two adjacent battery cells for cell balancing. The arrangements lower pin count packages but do not attain the precision and accuracy of a cell voltage measurement while cell balance is enabled. For example, in arrangements shown in FIGS. 8, 9, and 10, once cell balancing is enabled, measurements of cell voltage are unavailable or detrimentally affected. In these example arrangements, four pins are used to monitor two cells in contrast to the three pins used in the embodiments disclosed herein, such as shown in FIGS. 1 through 7.

Figure 8:
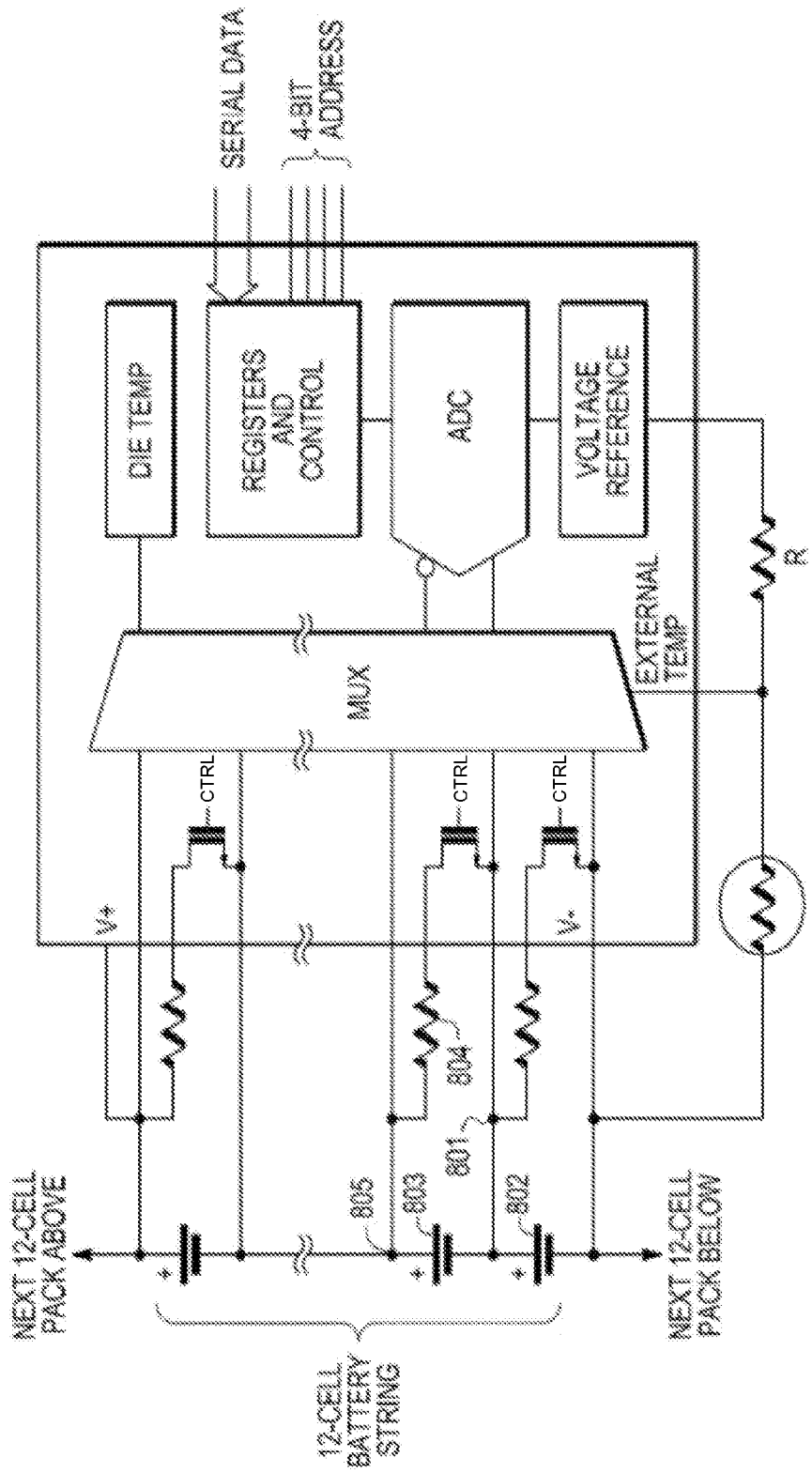
FIG. 8, labeled PRIOR ART, is a block and circuit diagram illustrating a battery monitoring circuit in which current from a cell balance FET significantly affects cell voltage measurement precision and accuracy.

As shown in FIG. 8, labeled PRIOR ART, a block and circuit diagram illustrates a battery monitoring circuit in which current from a cell balance FET significantly affects cell voltage measurement precision and accuracy. Thus, cell balancing must be disabled to measure cell voltage.

In the illustrative arrangement, a pin 801 is used for measurement of battery voltage. The pin 801 is connected to the positive terminal of one battery cell 802 and to the negative terminal of an adjacent battery cell 803, and is used to perform a precision three or four millivolt measurement of that cell voltage. To facilitate the cell voltage measurement, a resistor 804 is connected to a pin 805 connected to the positive terminal of the battery cell 803. The same pin 805 on the IC is also used for passive cell balancing. By using the same pin 805 for voltage measurement and cell balancing causes a substantial reduction in precision for the measurement.

Thus, cell balancing is disabled to make a measurement because the ADC used for measurement would otherwise pass a cell balancing current and the measurement would be inaccurate because the approximately 300 milliamperes passing through a bond wire causes a voltage drop across the wire and across the pin. The system positions a low pass filter external to the integrated circuit to address the voltage drop. If the low pass filter external to the device is eliminated, aliasing is presented to the ADC.

Thus, a reduced pin count package is attained but at the expense of measurement accuracy and precision. A deficiency arises in which the cell must be disabled to perform an accurate measurement, then re-enabled after the measurement.

Figure 9:
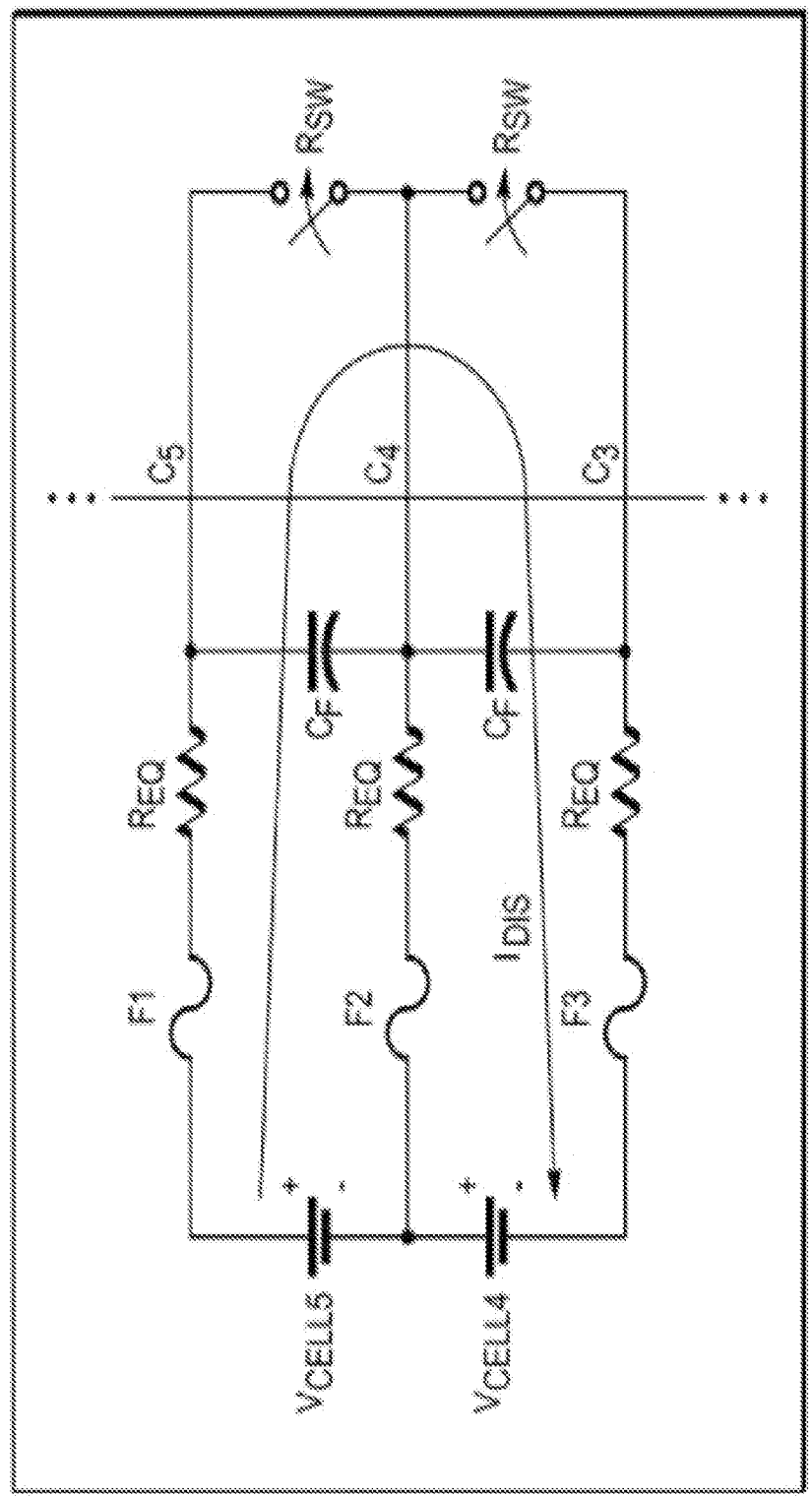
FIG. 9, labeled PRIOR ART, is a circuit diagram showing an arrangement in which cell terminal inputs are used for both measuring and cell balance.

Referring to FIG. 9, labeled PRIOR ART, a circuit diagram shows an arrangement in which cell terminal inputs are used for both measuring and cell balance. Cell balancing must be disabled during measurement, creating significant software overhead to attain accurate measurements. Measurements can be acquired during cell balancing by using internal cell balancing switches. When the switches are used, measured voltage on the $C_N$ to $C_{N+1}$ input connections is reduced by external $R_{EQ}$ resistors. For accurate cell voltage measurements, disabling the internal cell balancing switch is required. In example operation, the switches are not disabled automatically during a conversion. After the internal cell balancing switch is disabled, software allows the input voltage to settle for a time period $t_{SETTLE}$ which is selected based on components including capacitor $C_F$ and resistor $R_{EQ}$ (for example $t_{SETTLE} = 10 \times C_F \times R_{EQ}$) before performing a cell measurement sequence. The resistor values $R_{EQ}$ are selected based on cell resistance requirements. A low pass filter (LPF) requires higher resistance values to be effective.

Thus, in an example implementation, a microprocessor can communicate with the circuit such as by disabling the cell balancing, then sending another message, taking a reading, and when the reading is complete, collecting the data, then sending another message to re-enable cell balancing. Thus, many messages communicate back and forth in operations that add very little to functionality. Thus, bandwidth of communication protocol is greatly increased, adding higher overhead to communication.

In the illustrative circuit, cell balance must be disabled to perform the cell voltage measurement since the same input terminals are used to measure the cell voltage and balance the cell.

In an example arrangement, the resistors $R_{EQ}$ have a resistance of about 15 or 16 ohms, a sufficiently low impedance to form, in combination with the capacitor $C_F$ capacitor, a very high frequency low pass filter. The resulting low pass filter may no longer meet the requirements for the cell voltage measurement.

Figure 10:
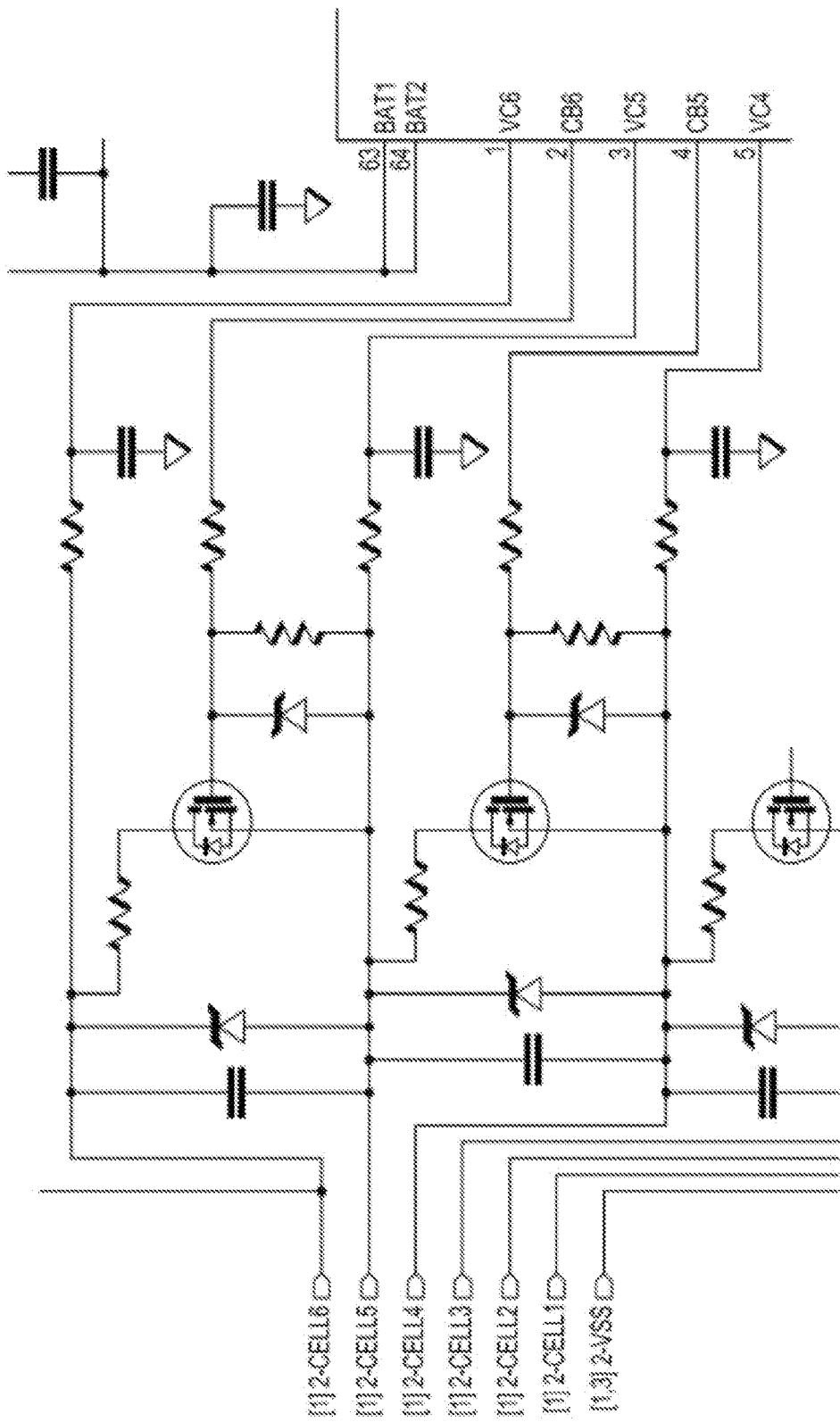
FIG. 10, labeled PRIOR ART, is a circuit diagram showing a measurement circuit in which a predriver is connected to an external FET.

FIG. 10, labeled PRIOR ART, is a circuit diagram showing a measurement circuit in which a predriver is connected to an external FET. Internal cell balancing is not available. An external FET is driven on and off. External Cell Balance FET and protective components enable cell balance functionality. Added external components include a zener gate-to-source clamp, a pull-down resistor, and a gate bias resistor. These three external components are used to accomplish the cell balance functionality. In contrast, the illustrative embodiment shown in FIG. 1 adds only one external load resistor to enable cell balance. The system shown in FIG. 10 adds significant cost to the system. Another difficulty with a configuration that includes multiple external devices or components is the potential for solder-joint integrity concerns. The illustrative circuit includes three terminals and adds ten solder joints for testing and which are potential failure points. Advantages of external components include improved accuracy for cell voltage measurements while reducing heating temperature effects that are difficult to attain with on-board cell balancing.

While the principles of the disclosed system are described above in connection with specific apparatus, it is to be clearly understood that this description is made only by way of example and not as a limitation on scope of the appended claims.

The illustrative pictorial diagrams depict structures and process actions in a manufacturing process. Although the particular examples illustrate specific structures and process acts, many alternative implementations are possible and commonly made by simple design choice. Manufacturing actions may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, shapes, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. An electronic circuit comprising:
a battery monitoring integrated circuit configured for monitoring a plurality of cells in a battery stack, the battery monitoring integrated circuit arranged to share a common node pin between two adjacent cells in the battery stack for the purpose of cell balancing.

2. The electronic circuit according to claim 1 further comprising:
at least one external resistor coupled to cells in the battery stack configured to dissipate power of the cell.

3. The electronic circuit according to claim 1 wherein the battery monitoring integrated circuit comprises:
a plurality of connector pins; and
a plurality of cell balance transistors coupled to the plurality of connector pins for connection to the battery stack comprising a plurality of cells coupled in series, ones of the plurality of cell balance transistors forming a source-drain pathway connected between connector pins coupled between the positive and negative terminal of ones of the cells wherein adjacent cell balance transistors share a connector pin of the plurality of connector pins.

4. The electronic circuit according to claim 3 wherein:
the plurality of cell balance transistors comprise field effect transistors.

5. The electronic circuit according to claim 3 wherein:
the plurality of cell balance transistors comprise field effect transistors selected from at least one of n-channel metal-oxide semiconductor (NMOS) and p-channel metal-oxide semiconductor (PMOS) transistors.

6. The electronic circuit according to claim 3 wherein:
the battery monitoring integrated circuit further comprises an analog to digital converter coupled to selected ones of the plurality of connector pins comprising connector pins configured for coupling to the positive terminal of ones of the plurality of cells and connector pins configured for coupling to the negative terminal of ones of the plurality of cells.

7. The electronic circuit according to claim 3 wherein:
the battery monitoring integrated circuit is configured for performing cell balancing in a package that shares selected ones of the plurality of connector pins that connect between adjacent ones of the plurality of cell balance transistors.

8. The electronic circuit according to claim 3 wherein:
the plurality of connector pins comprises selected connector pins configured for performing cell voltage measurements and selected connector pins configured for performing cell balancing wherein cell voltage measurement is performed when cell balance functionality is enabled.

9. The electronic circuit according to claim 1 further comprising:
a cell voltage measurement input filter coupled to the battery monitoring integrated circuit at selected ones of a plurality of connector pins.

10. The electronic circuit according to claim 1 further comprising:
a cell voltage measurement input filter coupled to the battery monitoring integrated circuit at selected ones of a plurality of connector pins; wherein:
the battery monitoring integrated circuit comprises a plurality of integrated cell balance field effect transistors.

11. The electronic circuit according to claim 1 wherein:
the battery monitoring integrated circuit comprises a plurality of connector pins including selected connector pins allocated for balancing cells of the plurality of cells in a battery stack wherein two adjacent cells are coupled to three of the selected connector pins including the common node pin shared between the two adjacent cells.

12. The electronic circuit according to claim 1 wherein:
the battery monitoring integrated circuit is configured for cell balance and cell voltage measurement functionality in at least one system selected from a group of systems consisting of automotive high voltage management, battery-operated industrial equipment, hand-held battery-operated equipment, electric power commercial battery backup, electric vehicle battery, and lithium ion battery.

13. The electronic circuit according to claim 1 wherein the battery monitoring integrated circuit comprises:
a plurality of connector pins comprising at least cell balance connector pins and cell voltage measurement connector pins distinct of the cell balance connector pins;
a battery cell voltage measurement circuit selectively coupled to ones of the cell voltage measurement connector pins; and
an on-chip cell balancing circuit selectively coupled to ones of the cell balance connector pins.

14. A method for operating electronic circuit comprising:
monitoring a plurality of cells in a battery stack; and
cell balancing selected cells in the battery stack using a plurality of cell balancing transistors coupled to the plurality of cells with a common node pin shared between two adjacent cells.

15. The method according to claim 14 further comprising:
dissipating power of ones of the plurality of cells in the battery stack using at least one external resistor.

16. The method according to claim 14 further comprising:
providing a battery stack comprising a plurality of cells coupled in series;
monitoring charge in the battery stack using a plurality of cell balance transistors coupled to the plurality of cells via a plurality of connector pins wherein ones of the plurality of cell balance transistors are coupled to form a source-drain pathway connected between connector pins coupled between the positive and negative terminal of ones of the cells and a connector pin of the plurality of connector pins is shared between adjacent cell balance transistors; and
imposing additional load on selected cells of the battery stack based on the monitored charge using the plurality of cell balance transistors.

17. The method according to claim 16 further comprising:
coupling an analog to digital converter to selected ones of the plurality of connector pins comprising connector pins configured for coupling to the positive terminal of ones of the plurality of cells and connector pins configured for coupling to the negative terminal of ones of the plurality of cells.

18. The method according to claim 16 further comprising:
coupling a cell voltage measurement input filter to selected ones of a plurality of connector pins.

19. The method according to claim 16 further comprising:
performing cell balancing concurrently with cell voltage measurement.

20. The method according to claim 14 further comprising:
monitoring the plurality of cells in the battery stack for cell balance and cell voltage measurement functionality in at least one system selected from a group of systems consisting of automotive high voltage management, battery-operated industrial equipment, hand-held battery-operated equipment, electric power commercial battery backup, electric vehicle battery, and lithium ion battery.

* * * * *